US008675001B2

(12) United States Patent
Roth

(10) Patent No.: US 8,675,001 B2
(45) Date of Patent: Mar. 18, 2014

(54) EFFICIENT MEMORY MANAGEMENT FOR PATH DETERMINATION IN MEMORY SPACE LIMITED PARALLEL PROCESSING SYSTEMS

(75) Inventor: Jochen Roth, Rickenbach (DE)

(73) Assignee: International Business Machines Corporation, Armonk, NY (US)

( * ) Notice: Subject to any disclaimer, the term of this patent is extended or adjusted under 35 U.S.C. 154(b) by 271 days.

(21) Appl. No.: 12/782,852

(22) Filed: May 19, 2010

(65) Prior Publication Data

US 2010/0309223 A1 Dec. 9, 2010

(30) Foreign Application Priority Data

Jun. 4, 2009 (DE) .................................. 09161904

(51) Int. Cl.
*G06F 13/14* (2006.01)
*G06T 1/00* (2006.01)
*G09G 5/36* (2006.01)
*G06F 12/00* (2006.01)
*G09G 5/00* (2006.01)
*G06K 9/00* (2006.01)

(52) U.S. Cl.
USPC ........... 345/522; 345/519; 345/520; 345/557; 345/564; 345/629; 382/106; 382/128

(58) Field of Classification Search
USPC ......... 345/519–522, 557, 564–566, 629, 502; 382/106, 128; 711/154
See application file for complete search history.

(56) References Cited

U.S. PATENT DOCUMENTS

| | | | | |
|---|---|---|---|---|
| 6,052,477 A | * | 4/2000 | Wang et al. | 382/131 |
| 7,319,328 B1 | * | 1/2008 | Karmonik et al. | 324/318 |
| 2005/0001848 A1 | * | 1/2005 | Colavin | 345/566 |
| 2005/0251629 A1 | * | 11/2005 | Fahs et al. | 711/137 |
| 2008/0181472 A1 | * | 7/2008 | Doi et al. | 382/128 |
| 2010/0289804 A1 | * | 11/2010 | Jackman et al. | 345/520 |

OTHER PUBLICATIONS

Abraham Arevalo, Ricardo M. Matinata, Maharaja Pandian, Eitan Peri, Kurtis Ruby, Francois Thomas, Chris Almond 2008, Programming the Cell Broadband Engine—Architecture: Examples and Best Practices. IBM Redbooks.*
Dominik Meiländer, Maraike Schellmann, Sergei Gorlatch, Implementing a Data-Parallel Application with Low Data Locality on Multicore Processors 2009, 2009 22nd International Conference on Architecture of Computing Systems (ARCS), pp. 1-8.*

(Continued)

*Primary Examiner* — Aaron M Richer
*Assistant Examiner* — Michael J Cobb
(74) *Attorney, Agent, or Firm* — Yudell Isidore N Russell PLLC

(57) ABSTRACT

The present invention relates to a method for processing data entities by a data processing system, wherein: a first and a second set of data entities are stored in a main memory and associated with a respective first and second set of points of a domain; the first set of data entities is loaded into a local storage; one or more first calculations are performed using the first set of data entities to generate first calculated data; the second set of data entities is determined according to at least some of the first calculated data; the determined second set of data entities is loaded into the local storage; and one or more second calculations are performed using the second set of data entities resulting in second calculated data.

20 Claims, 12 Drawing Sheets

(56) References Cited

OTHER PUBLICATIONS

M. Mustafa Rafique, Ali R. Butt, and Dimitrios S. Nikolopoulos DMA-based Prefetching for I/O-Intensive Workloads on the Cell Architecture 2008, Proceedings of the 5th conference on Computing frontiers, Ischia, Italy.*

Rong Xue, Peter CM van Ziji, Barbara J. Crain, Meiyappan Solaiyappan, Susumu Mori in vivo three-dimensional reconstruction of rat brain axonal projections by diffusion tensor imaging 1999, Magnetic Resonance in Medicine, vol. 42, pp. 1123-1127.*

Vaidyanathan Srinivasan, Anand K. Santhanam, Madhavan Srinivasan Cell Broadband Engine Processor DMA engines, Part 2: From an SPE Point of View 2006, IBM DeveloperWords, http://www.ibm.com/developerworks/power/library/pa-celldmas2/ (accessed Jun. 6, 2012), pp. 1-10.*

Aditya Kwatra, Viktor Prasanna, Manbir Singh Accelerating DTI Tractography using FPGAs 2006, 20th International Parallel and Distributed Processing Symposium.*

J. A. Kahle, M. N. Day, H. P. Hofstee, C. R. Johns, T. R. Maeurer, D. Shippy Introduction to the Cell Multiprocessor 2005, IBM Journal of Research and Devlopment, vol. 49 (4/5), pp. 589-604.*

Won-Ki Jeong, P. Thomas Fletcher, Ran Tao, Ross T. Whitaker, Interactive Visualization of Volumetric White Matter Connectivity in DT-MRI Using a Parallel-Hardware Hamilton-Jacobi Solver, 2007, IEEE Transactions on Visualization and Computer Graphics, 23(6):1480-1487.*

Hangyi Jiang, Peter C.M. van Zijl, Jinsuh Kim, Godfrey D. Pearlson, Susumu Moria, DtiStudio: Resource program for diffusion tensor computation and fiber bundle tracking, 2006, Computer Methods and Programs in Biomedicine, 81:106-116.*

Steve VanderWiel, David J. Lilja, a Survey of Data Prefetching Techniques, 1996, Technical REport No. HPPC-96-05, University of Minnesota.*

Stefan G. Berg, Cache Prefetching, 2002, Technical Report UW-CSE Feb. 2, 2004, University of Washington.*

J. Roth, H. Schiffbauer, P. Väterlein, a Parallel Computing Approach for Tracking of Neuronal Fibers, 2009, IBM Journal of Research & Development, 53(5):11:1-9.*

Peter J. Basser, Sinisa Pajevic, Carlo Pierpaoli, Jeffrey Duda, Akram Aldroubi, In Vivo Fiber Tractography Using DT-MRI Data, 2000, Magnetic Resonance in Medicine 44:625-632.*

Susumu Mori, Peter C.M. van Zijl, Fiber Tracking: Principles and Strategies—A Technical Review, 2002, NMR in BioMedicine, 15:468-480.*

Bin Chen and Allen W. Song, DTI Fiber Tracking with Local Tissue Property Sensitivity: Phantom and In Vivo Validation, 2008, Magn Reson Imaging, 26(1):103-108.*

Ralph Brecheisen, Bram Platel, Anna Vilanova, and Bart ter Haar Romeny, Parameter Sensitivity Visualization in DTI Fiber Tracking, 2009, IEEE Transactions on Visualization and Computer Graphics, 15(6):1441-1448.*

* cited by examiner

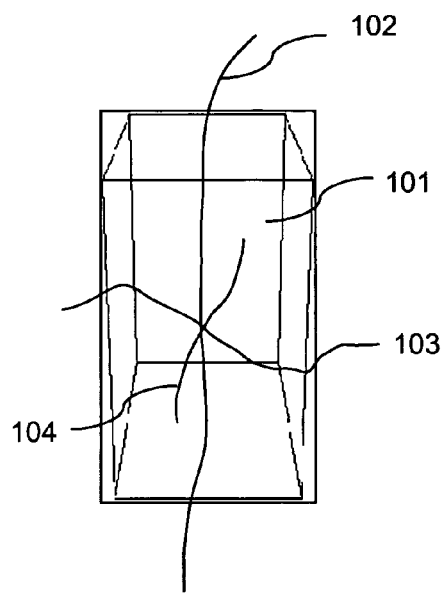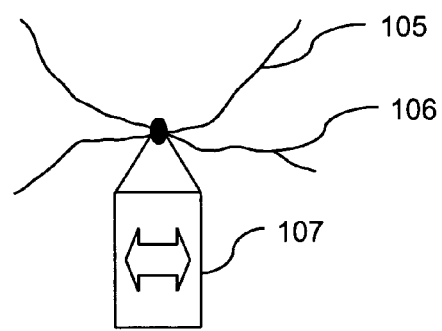
Fig. 1a
Fig. 1b

| 0A  | 2000 | 2000 | 2000 | 2000 |
|-----|------|------|------|------|

| 0B  | 0100 | 0100 | 0100 | 0100 |
|-----|------|------|------|------|

| 0C  | 0000 | 0001 | 0002 | 0003 |
|-----|------|------|------|------|

| 0A' | 2000 | 2100 | 2200 | 2300 |
|-----|------|------|------|------|

EFFICIENT MEMORY MANAGEMENT FOR PATH DETERMINATION IN MEMORY SPACE LIMITED PARALLEL PROCESSING SYSTEMS

PRIORITY CLAIM

The present application claims benefit of priority under 35 USC §120, §365 to the previously filed German Patent Application No. 09161904.9 entitled, "Efficient Memory Management For Path Determination In Memory Space Limited Parallel Processing Systems" with a priority date of Jun. 4, 2009, which is incorporated by reference herein.

BACKGROUND OF THE INVENTION

1. Field of the Invention

The present invention relates to a method for processing data entities by a data processing system, the data entities being associated with respective points of a domain. The invention further relates to a computer system for executing the method, and a computer program product containing code portions to execute the method.

2. Description of Prior Art

Diffusion Tensor Imaging (DTI) is emerging as an important technology in magnetic resonance imaging (MRI) for elucidating the internal structure of the brain and characteristic pathologic conditions affecting the integrity of the nervous system.

DTI measurements of the brain exploit the fact that the network of neural fibers has a characteristic microstructure that largely constrains the diffusion of water molecules along the direction of the fiber. Diffusion Tensor Imaging enables the fiber tracking of neural fibers which is also known as tractography. A three-dimensional (3D) measurement domain is divided into small volume elements, called voxels, representing image data on a regular grid. For each voxel, a Fractional Anisotropy value is calculated from three eigenvalues of the 3D diffusion tensor. Starting the fiber tracking algorithm from every voxel with a fractional anisotropy value greater than 0.4 is highly compute-intensive. Currently, these "seed points" are limited to user-defined regions of interest (ROI). Because of many branching, crossing, touching and merging fibers, starting the fiber trace algorithm from every possible seed point results in more realistic images.

SUMMARY

It is thus an objective of the present invention to provide a faster method and a system for processing data entities using a specific processing unit, wherein data entities are stored in a main memory and are associated with respective points of a domain, while the specific processing unit cannot directly access the data entities in the main memory, but only data entities stored in a space-limited local storage.

This objective of the present invention is achieved by a method for processing data entities by a data processing system. The data entities are associated with respective points of a domain. The data processing system has a main memory and a first processing element. The main memory stores the data entities to be processed. The first processing element has a local storage. The method comprises the following: loading a first set of data entities from the main memory into the local storage, where the first set of data entities is associated with a first set of respective contiguous points of the domain; performing some first calculations using the first set of data entities to generate/produce first calculated data; and determining a second set of data entities from the main memory according to at least some of the first calculated data. The second set of data entities is associated with a second set of respective contiguous points of the domain. The method further comprises: loading the determined second set of data entities from the main memory into the local storage; and performing some second calculations using the second set of data entities to generate/produce second calculated data.

Another aspect of the present invention is that the local storage has a first and a second buffer. The first set of data entities is loaded into the first buffer. The first calculations comprise a pre-determined load calculation step to determine the second set of data entities. The first calculations are continued while loading the determined second set of data entities into the second buffer.

Another aspect of the present invention is that the first calculations perform a sequence of calculation steps using respective subsets of the data entities being associated with respective subsets of contiguous points of the domain. An initial subset of the data entities is pre-determined. A succeeding calculation step uses a subset of the data entities that are determined by a preceding calculation step, and a final calculation step of the first calculations is also pre-determined.

Another aspect of the present invention is that the data entities and the calculated data comprise coordinate information referring to points of the domain.

Another aspect of the present invention is that the data entities further comprise direction information that is used for the calculation of the coordinates and termination information that is used to determine a final calculation step.

Another aspect of the present invention is that the data entities of the domain are obtained by a 3D imaging technique and the direction information represents a direction of nervous fiber tracts in 3D tissue.

Another aspect of the present invention is that the first processing element loads a first sequence of sets of data entities to perform a first sequence of respective calculations resulting in first image data.

Another aspect of the present invention is that the data processing system is a parallel processing system. The parallel processing system further comprises a second processing element that is loading a second sequence of sets of data entities to perform a second sequence of respective calculations resulting in second image data. The first and second image data are superimposed resulting in superimposed image data.

Another aspect of the present invention is that the domain has two dimensions (2D) and is a rectangle. A direct memory access (DMA) list determines a 2D set of data entities being associated with respective points of a 2D rectangular segment of the domain by specifying an initial address of the main memory, a first segment dimension, a second segment dimension and a first domain dimension.

Another aspect of the present invention is that the domain has three dimensions (3D) and is a cuboid. A set of DMA lists determines a 3D set of data entities being associated with respective points of a 3D cuboidal segment of the domain by further specifying a third segment dimension and a second domain dimension.

Another aspect of the present invention is that the calculations are performed by using single instructions on multiple data (SIMD).

The present invention further relates to a data processing system, which comprises a main memory (MM) for storing data entities associated with respective points of a domain and a first processing element. The first processing element has a processing unit, a local storage (LS) and a memory flow controller (MFC). Adapted means of the memory flow controller load a first set of data entities from the main memory into the local storage. The first set of data entities is associated with a first set of respective contiguous points of the domain. The adapted means of the memory flow controller further load a determined second set of data entities from the main memory into the local storage. Adapted means of the processing unit perform one or more first calculations using the first set of data entities and generate first calculated data, and determine a second set of data entities from the main memory, according to at least some of the first calculated data. The second set of data entities is associated with a second set of respective contiguous points of the domain. The adapted means of the processing unit further perform some second calculations using the second set of data entities and generate second calculated data.

Another aspect of the present invention provides a first buffer of the local storage and a second buffer of the local storage. The first buffer of the local storage stores the first set of data entities. The second buffer of the local storage stores the determined second set of data entities. Further adapted means of the memory flow controller load the first set of data entities into the first buffer and the determined second set of data entities into the second buffer. Further adapted means of the processing element perform the first calculations on the first set of data entities stored in the first buffer. The first calculations comprise a pre-determined load calculation step to determine the second set of data entities. The further adapted means of the processing unit continue the first calculations while loading the determined second set of data entities into the second buffer.

Another aspect of the present invention provides adapted means of the first processing element and a second processing element. The first processing element loads a first sequence of sets of data entities to perform a first sequence of respective calculations resulting in first image data. The second processing element loads a second sequence of sets of data entities to perform a second sequence of respective calculations resulting in a second image data. The data processing system further comprises means for superimposing first and second image data resulting in superimposed image data.

The present invention further relates to a computer program product for execution in a data processing system comprising computer program code portions for performing the following steps for processing data entities. The data entities are associated with respective points of a domain. The data processing system has a main memory and a first processing element. The main memory stores the data entities to be processed. The first processing element has a local storage. The method comprises: loading a first set of data entities from the main memory into the local storage, where the first set of data entities is associated with a first set of respective contiguous points of the domain. The method the comprises: performing one or more first calculations using the first set of data entities to generate first calculated data; determining a second set of data entities from the main memory according to at least some of the first calculated data. The second set of data entities is associated with a second set of respective contiguous points of the domain. The method further comprises: loading the determined second set of data entities from the main memory into the local storage; and performing some second calculations using the second set of data entities to generate second calculated data.

BRIEF DESCRIPTION OF THE DRAWINGS

The present invention is illustrated by way of example, but is not limited by the shape or specific content of the figures of the drawings, in which:

FIGS. 1a-1b are diagrams illustrating multiple fiber tracts penetrating a voxel.

FIG. 6b illustrates an application of the Single Instruction on Multiple-Data technique (SIMD).

DETAILED DESCRIPTION

Figure 2A:
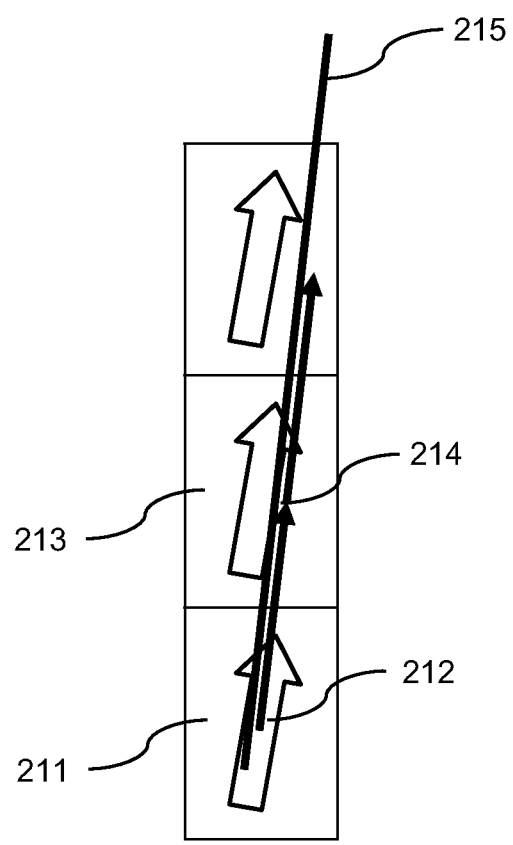
FIG. 2a illustrates a projection of multiple voxels that shows the tracking of a fiber using floating point coordinates as tips of major eigenvectors.

In the drawings and specification, there has been set forth a preferred embodiment of the invention and, although specific terms are used, the description thus given uses terminology in a generic and descriptive sense only and not for purposes of limitation. It will, however, be evident that various modifications and changes may be made thereto without departing from the broader spirit and scope of the invention as set forth in the appended claims.

The present invention can be realized in hardware, software, or a combination of hardware and software. Any kind of computer system—or other apparatus adapted for carrying out the methods described herein—is suited. A typical combination of hardware and software could be at least one general-purpose computer system with a computer program that, when being loaded and executed, controls the at least one computer system such that it carries out the methods described herein. The present invention can also be embedded in a computer program product, which comprises all the features enabling the implementation of the methods described herein, and which—when being loaded in the at least one computer system—is able to carry out these methods. The computer program product may comprise a computer readable medium on which the computer program code is embedded or stored or transmitted. Thus, for example, the computer readable medium may be a computer storage medium.

A computer program or computer program product in the present context mean any expression, in any language, code or notation, of a set of instructions intended to cause a system having an information processing capability to perform a particular function either directly or after either or both of the following a) conversion to another language, code or notation; b) reproduction in a different material form.

Diffusion Weighted Imaging (DWI) is a specific MRI modality that produces in vivo images of biological tissues weighted with the local micro structural characteristic of water diffusion. An additional diffusion-weighting magnetic field gradient further attenuates the measured Magnetic Resonance (MR) signal beyond that caused by common transversal magnetic spin relaxation. For each voxel, a diffusion tensor is determined by measuring a collection of apparent diffusion coefficients (ADC) along multiple gradient field directions. The ADC is calculated from a signal measured with the respective gradient field compared with a signal measured without gradient field. The length and direction of a diffusion gradient vector respectively represent the ADC value and the direction of the gradient field. Thus, a collection of diffusion gradient vectors is associated with each voxel and is pointing on a three-dimensional surface. The idea is now to find an ellipsoid that has approximately the same surface as spanned by the diffusion gradient vectors. The determination of the symmetric diffusion tensor representing this ellipsoid requires at least six measurements in six directions. To achieve better results, repetitive acquisition and averaging of the images is useful.

In the examined brain, so-called grey matter consists of several layers of neurons and their unmyelinated fibers. In conjunction to this, myelinated axons—which are the extensions from one neuron to the next or to the effector organ—are called white matter. In white matter tracts, information is transferred between different regions of the central nervous system. The neurons in grey matter are responsible for processing the transferred information. The distinction between grey matter and white matter plays an important role in MRI because the white matter represents the fibers that are being tracked.

The specific DTI dataset used in the present invention contains $36 \times (20+1) = 756$ 3D images. The resolution is $256 \times 256$ voxels per slice. The full dataset comprises about 50 millions data entities, which allocate about 100 MB in the memory. The whole brain is imaged with 36 contiguous axial slices, which have a thickness of 3.6 mm. Each voxel has dimensions of 1 mm×1 mm×3.6 mm. To simplify numerical calculations, the voxel dimensions are scaled to a symmetrical cube with unity edge lengths. Before display of calculated image data, reverse scaling is applied. The 3D images are acquired using echo planar imaging with 20 different diffusion gradient field directions. Additionally, one 3D image without diffusion gradient field is acquired. The precision of the measurement is about 1 mm inside a slice to 3.6 mm perpendicular to the slice. As the diameter of an axon is approximately 20 μm, one voxel may contain multiple axons. The axons usually lie in parallel with one another, but may also cross or touch each other. The measurements with 20 different diffusion gradient directions are a compromise between image quality and the time needed for the measurements.

To track white matter tracts, the only interest lies in voxels showing anisotropic diffusion. Because of the symmetry of the diffusion tensor, three real number eigenvalues, $\lambda 1$, $\lambda 2$, and $\lambda 3$, can be found. The three eigenvectors can be interpreted as the three main directions of an ellipsoid and the three eigenvalues as the respective lengths of the diffusion gradient vectors. The eigenvectors usually have unity lengths. Therefore, we can assume that in anisotropic areas the fiber orientation is mainly in the direction of the major eigenvector. If all three eigenvalues are roughly the same ($\lambda 1 \approx \lambda 2 \approx \lambda 3$), we have an isotropic area and the diffusion tensor is a sphere. The isotropic area may represent grey matter or also a crossing of multiple fiber tracts. If one eigenvalue is much larger than the others ($\lambda 1 \gg \lambda 2 \approx \lambda 3$), the cigar-shaped diffusion tensor indicates an anisotropic area with fiber orientation in the direction of the major eigenvector. If one eigenvalue is smaller than the others ($\lambda 1 < \lambda 2 \approx \lambda 3$), the diffusion tensor is disc-shaped and indicates a crossing of at least two fiber tracts. For each voxel, a Fractional Anisotropy (FA) value is calculated from the three eigenvalues of the diffusion tensor. The FA is a measure for anisotropy which ranges from 0 (isotropic) to 1 (anisotropic). Calculating the FA for each voxel of a slice encoding isotropic voxels as black and anisotropic voxels as white gives a greyscale image. The resulting spatial distribution of FA values encoded as greyscale-values results in so-called "FA maps". High FA values refer to white matter because diffusion in white matter is limited by the myelin-shielded axons. Low FA mostly indicates grey matter instead.

The determination of fiber tracts requires for each voxel a respective FA value and a respective path vector for each voxel. The signals of 20 measurements with different gradient field directions overdetermine the 6 coefficients of the symmetric diffusion tensor. An approximate solution of a linear system of 20 equations with 6 unknowns results in the 6 coefficients of the diffusion tensor. To do this, a multiple linear regression calculation and a conjugate gradient method may be applied. Finally, a standard mathematical routine allows the calculation of the three eigenvalues and the respective eigenvectors. The FA value can be directly determined from a combination of the three eigenvalues. The path vector is the major eigenvector of the diffusion tensor.

In the present example of $256 \times 256 \times 36 = 2359296$ voxels, the respective data entities of 20 bytes use about 47 MB. These data entities are the basis for performing the method of the present invention.

The present invention is, however, not restricted to fiber tractography, but may be applied to other technical fields in which arbitrary paths or trajectories are determined within a pre-defined multi-dimensional domain. For simplicity, an example of the preferred embodiment is presented for voxels in a three-dimensional (3D) domain, but the present invention may also be applied to other domain dimensions, for example, 1D, 2D, 4D, etc.

Each data entity is associated with a respective voxel of the 3D domain and comprises information that allows determination of next coordinates of a tracking point that is located in one of the voxels of the 3D domain. This may be the respective voxel or a further voxel. The sequence of determined next coordinates results in a path in the 3D domain. The information of the data entities may be scalar or vector information. Examples for scalar information are the FA value of the preferred embodiment, or pressure, temperature, and density. The vector information may be, for example, the major eigenvector of the diffusion tensor, or momentum, velocity, and wave vector of propagating particles and waves.

Each data entity may additionally comprise respective start and termination information, which may be compared with pre-defined threshold values. The start information of a data entity allows for determination of whether the path tracking can start with a voxel associated with the data entity. The termination information of a data entity can be used to determine if the path tracking ends at the respective voxel.

In the preferred embodiment, each data entity of a DTI dataset comprises an FA value. When the FA value exceeds a start threshold, for example, FA=0.4, the respective voxel is used as a starting point for the path determination. If the FA value does not fall below a second threshold value, for example, FA=0.2, the respective voxel is determined to be part of the tracked path, otherwise the path determination is terminated.

In the remainder of the description, the terms "path", "trajectory", and "fiber tract" are used as synonyms.

A start voxel must be determined for each path. The following conditions may be applied to define this seeding point voxel:
1) a voxel that satisfies a start condition for the start information of the respective data entity
2) every voxel of a pre-defined region of interest (ROI)
3) every voxel of one slice 4) every voxel of the complete data set
5) combination of 1) and one of 2)-4).

The preferred embodiment uses the combination of 1) and 4). Even though the computational task is larger than with 2) and 3), starting the path determination at every voxel increases the reliability of the calculated image data. If the path determination starts at one voxel in a region of interest, the tracking algorithm produces one line which passes through the voxel.

In the example of fiber tractography, several fiber tracts (102, 103, 104) may penetrate a voxel (101) as shown in FIG. 1a (left). Consider a case in which two fiber tracts (105, 106) are "kissing" a voxel (107), as depicted in FIG. 1b (right), where the main diffusion direction is from left to right. When the fiber tracking algorithm starts at this voxel, the tracking algorithm results in only one fiber tract. To ensure that every incoming and outgoing fiber tract of this voxel is determined, the fiber tracking algorithm must start from every voxel of the region of interest.

The information of a respective path vector attached to each voxel enables following of a path using a line propagation method. In the example of fiber tractography, the path vector is the major eigenvector of the diffusion tensor. In a simplified approach, the path vector has the edge length of the voxel, which may be unity.

FIG. 2a shows a calculation method of a path. From the center (212) of a start voxel (211), the path vector is used to determine next coordinates of a next tracking point. The next coordinates result from adding the three path vector components to respective start coordinates. The next coordinates (214) may be located in the start voxel (211) or in one of the adjacent voxels (213). The determined next coordinates are floating point values, which do not have to coincide with the center or borders of a voxel. The resulting trajectory (215) is parallel to the path vectors.

The following refinements may provide even better results for the determination of the trajectories:
1) Interpolation of path vector directions of a voxel containing a current tracking point and at least one closest adjacent voxel weighted by the distance of the current tracking point from the respective voxel centers.
2) Interpolation of path vector directions of a voxel containing the current tracking point and a subset of surrounding voxels weighted by the distance of the current tracking point from the respective voxel centers.
3) Fix scaling of the path vector length to less than the voxel edge length, for example, one half of the voxel edge length or even less.
4) Dynamic scaling of the path vector length depending on information of the data entities, for example, the higher the FA value, the longer may be the path vector.
5) Considering previous coordinates while calculating next coordinates to determine the direction of the trajectory.

Figure 2B:
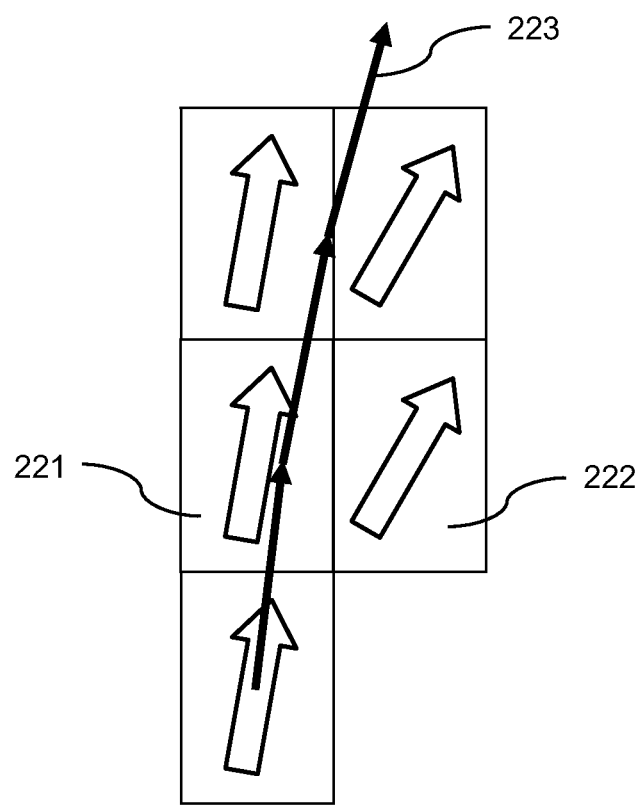
FIG. 2b illustrates a projection of multiple voxels that shows the tracking of a fiber using an interpolation between neighboring major eigenvectors.

FIG. 2b illustrates an example of path determination using an interpolation between neighboring path vector directions (221, 222). The resulting trajectory (223) shows the best correspondence with the path vector directions.

As shown in FIG. 1 (right), in the voxel (107), the major eigenvector of the diffusion tensor can point into two opposite directions. Therefore, the path determination must consider both directions of the major eigenvector to get the complete fiber tract.

Figure 3A:
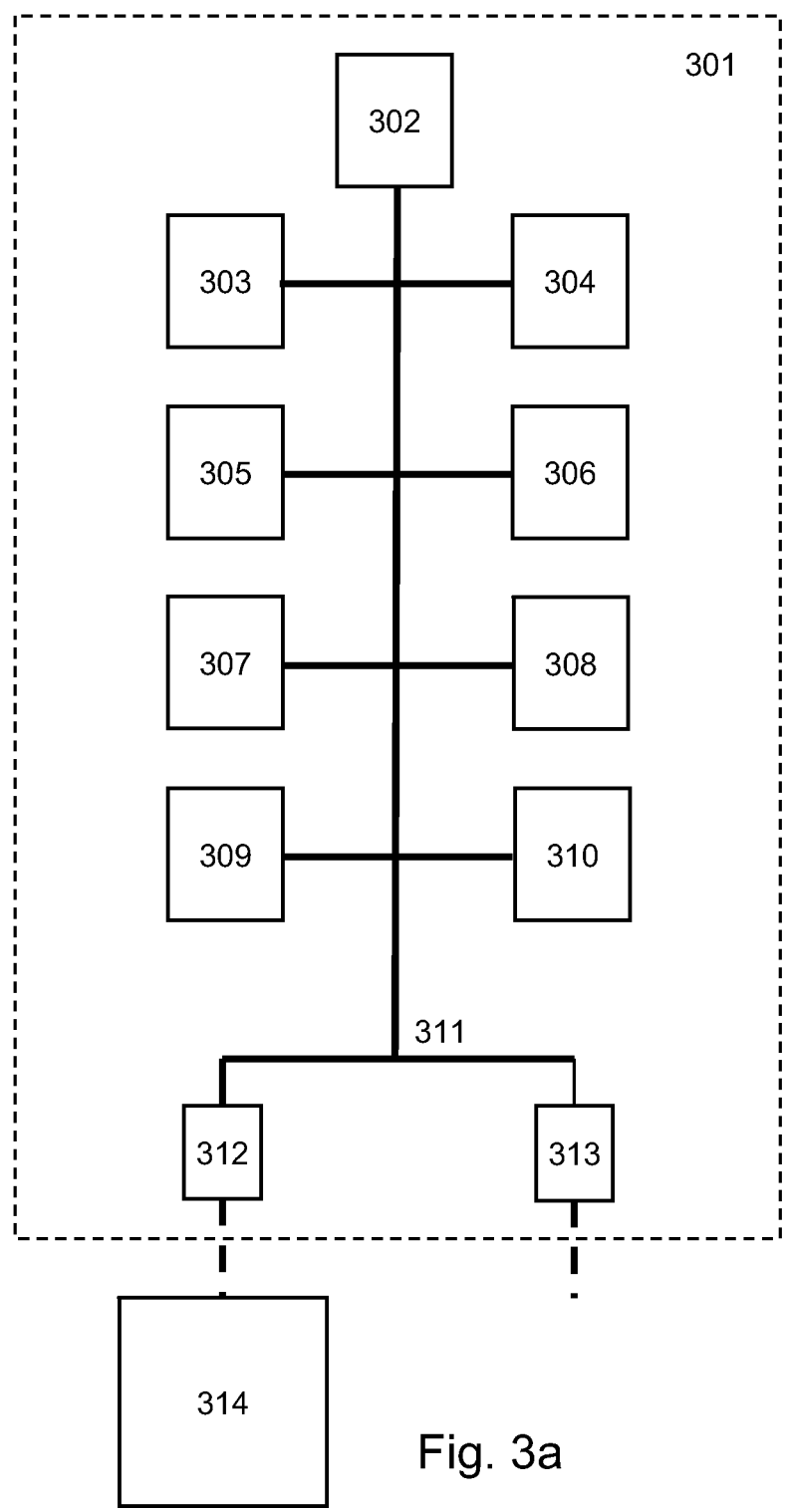
FIG. 3a is a high-level block diagram of a Cell Broadband Engine (CBE) processor.

FIG. 3a shows a high-level block diagram of a Cell Broadband Engine™ (CBE) processor hardware. The CBE processor is the first implementation of a new multiprocessor family conforming to a Cell Broadband Engine Architecture (CBEA). The IBM® PowerXCell® 8i® processor (301) implements the CBEA with nine processor elements, which is used, for example in the IBM BladeCenter® QS22. The processor elements are operating on a shared, coherent memory (314), which is also called main memory or main storage in the remainder of this description. In a multi-processor system, memory coherence prevents two or more concurrent processors retrieving inconsistent data from one shared memory by way of their respective caches. The shared memory is usually separate from the processor chips. Although all processor elements share the memory, their function is specialized into two types: the Power Processor Element (PPE) and the Synergistic Processor Element (SPE). The CBE processor (301) has one PPE (302) and eight SPEs. (303, . . . , 310). The first type of processor element, the PPE, is intended primarily for control processing, running operating systems, managing system resources, and managing SPE threads. The second type of processor element, the SPE, is optimized for running compute-intensive applications and is not optimized for running an operating system. There is a mutual dependence between the PPE and the SPEs. The SPEs depend on the PPE to run the operating system, and, in many cases, the top-level thread control for an application. The PPE depends on the SPEs to provide the bulk of the application performance. All processor elements are connected to each other and to the on-chip DRAM shared memory controllers (312) and I/O controllers (313) by the memory-coherent element interconnect bus (EIB) (311).

Figure 3B:
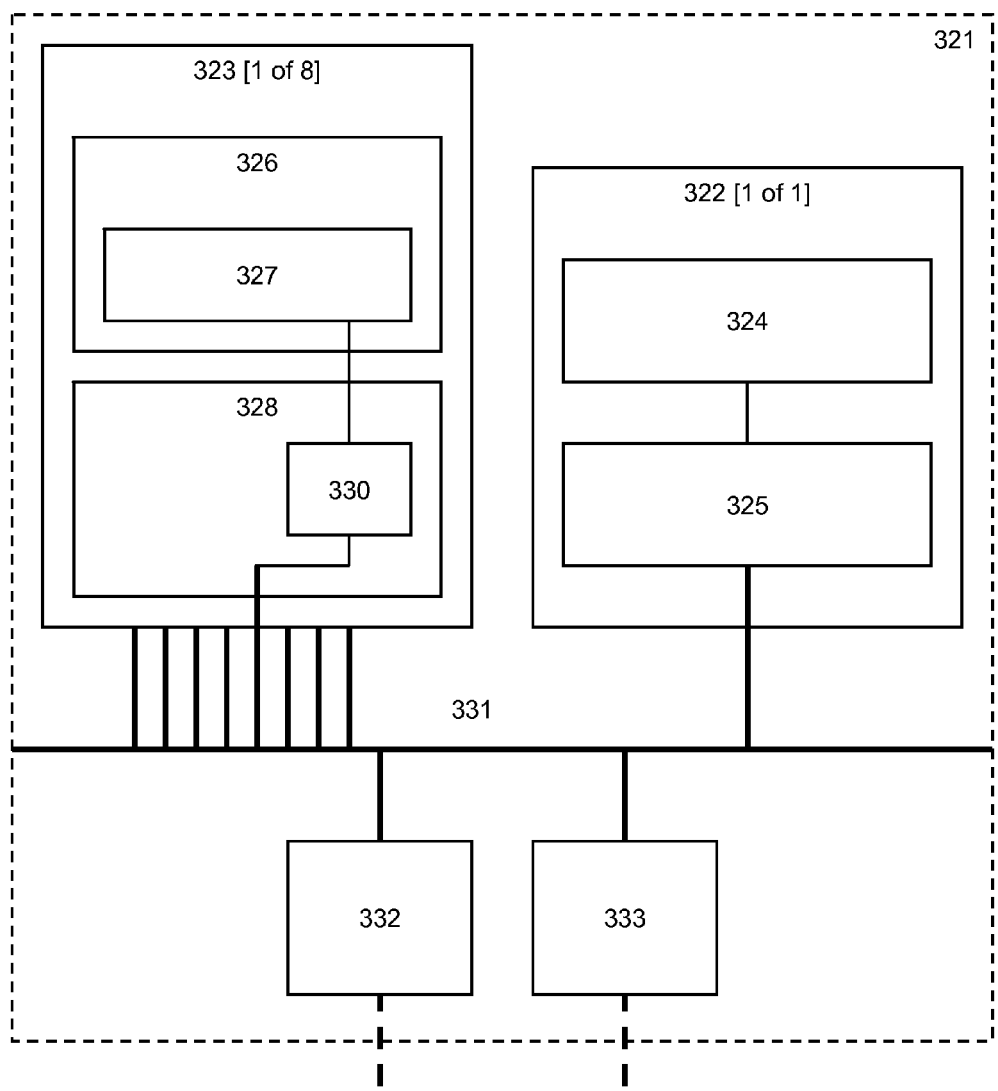
FIG. 3b is a more detailed block diagram of the CBE processor.

FIG. 3b is a more detailed block diagram of the CBE processor (321), which shows the PPE (322) and one of the eight SPEs (323) that are connected to each other and to the on-chip shared memory controllers (332) and to the I/O controllers (333) by way of the EIB (331).

The PPE contains a PowerPC Processor Unit (PPU) (324), which is a 64-bit PowerPC dual-thread PowerPC Architecture reduced instruction set computer (RISC) core and is well-suited to running 32-bit and 64-bit operating systems and applications. The PPE accesses the main storage space through its PowerPC Processor Storage Subsystem (PPSS) (325).

The SPEs are independent processor elements, each running their own individual application programs or threads. The eight identical SPEs are single-instruction, multiple-data (SIMD) processor elements that are optimized for data-rich operations allocated to them by the PPE. Each SPE contains a Synergistic Processor Unit (SPU) (326), which is a RISC core, and a software-controlled 256 kB private local memory (327), called a local store or local storage (LS), for instructions and data, and a large unified register file with 128 entries having 128 bits each. The register file supports many simultaneous "in flight" instructions at one processor cycle. The compiler automatically optimizes the program code to use these "in flight" instructions efficiently, for example, when performing calculations on local registers while loading other data from the local storage into other registers.

The SPEs access the main storage with Direct Memory Access (DMA) commands that move data and instructions between the main storage and the LS. An SPE's instruction-fetches and load and store instructions can only access the private LS of the SPE rather than shared main storage. This means that the SPU software uses LS addresses and not main storage effective addresses to do this. The LS has no associated cache. This 3-level organization of storage (register file, LS, main storage), with asynchronous DMA transfers between the LS and the main storage explicitly parallelizes computation with transfers of data and instructions that feed computation and store results of computation in the main storage, thus allowing simultaneous data and code transfers to cover long memory latencies.

Because SPEs lack shared memory, they must communicate explicitly with other entities in the system using these three communication mechanisms: DMA transfers, mailbox messages, and signal-notification messages. Each SPE has a channel interface for communication between its synergistic processor unit (SPU) (326) and its associated Memory Flow Controller (MFC) (328). The channels are unidirectional message-passing interfaces that are implemented in and managed by the SPE's memory flow controller (MFC).

The DMA transfers can be set up and controlled by the SPE that is sourcing or receiving the data, or by the PPE or another SPE. Compute intensive applications that use 32-bit or smaller data formats (such as single-precision floating point and integer), such as the present invention, are advantageous candidates for the CBE processor.

Each SPE's MFC contains a DMA controller (330). Data transfers between the associated LS and the main storage are performed by the SPE, or by the PPE or another SPE, using the DMA controller in the MFC associated with the LS. DMA transfer commands contain both a Local Store Address (LSA) and an Effective Address (EA) and thereby initiate transfers between the two storage domains. Thus, the LS can also be accessed by the PPE and devices other than the associated SPU through the main-storage space and the DMA controller.

Each MFC can also autonomously manage a sequence of DMA transfers in response to a DMA list command from its associated SPU, but not from the PPE or other SPEs. DMA list commands are used to move data between a contiguous area in an SPE's LS and possibly non-contiguous area in the effective address space. Each DMA command is tagged with a 5-bit tag group ID that allows software to check or wait on the completion of commands in a particular tag group. Peak transfer performance is achieved if both the effective addresses and the LS addresses are 128-byte aligned and the size of the transfer is an even multiple of 128 bytes. The DMA list of DMA transfers is a sequence of eight-byte list elements being constructed and stored in an SPE's local store, so that the SPE's DMA controller can process the list asynchronously while the SPE operates on previously transferred data.

The SPEs are designed to be programmed in high-level languages, for example, C/C++. They support a rich instruction set that includes extensive SIMD functionality. The SPEs support this special SIMD instruction set—the Synergistic Processor Unit Instruction Set Architecture—with accompanying C/C++ instructions and a unique set of commands for managing Direct Memory Access (DMA) transfers, external events, and inter-processor messaging and control.

The element interconnect bus (EIB) (331) is the communication path for commands and data between all processor elements on the CBE processor and the on-chip controllers for memory and I/O. The on-chip memory interface controller (MIC) (332) provides an interface between the EIB and the physical shared memory, which is usually separate from the processor chip. The MIC supports one or two extreme data rate (XDR) memory interfaces, which together support between 64 MB and 64 GB of XDR DRAM memory.

The SPU can only perform calculations on data in the local store (LS). Since the LS has only 256 KB and is much smaller than the total of data entities representing full image data, for example, 100 MB, only a fraction of the data entities can be loaded from the main memory into the LS and processed in the LS.

Figure 4A:
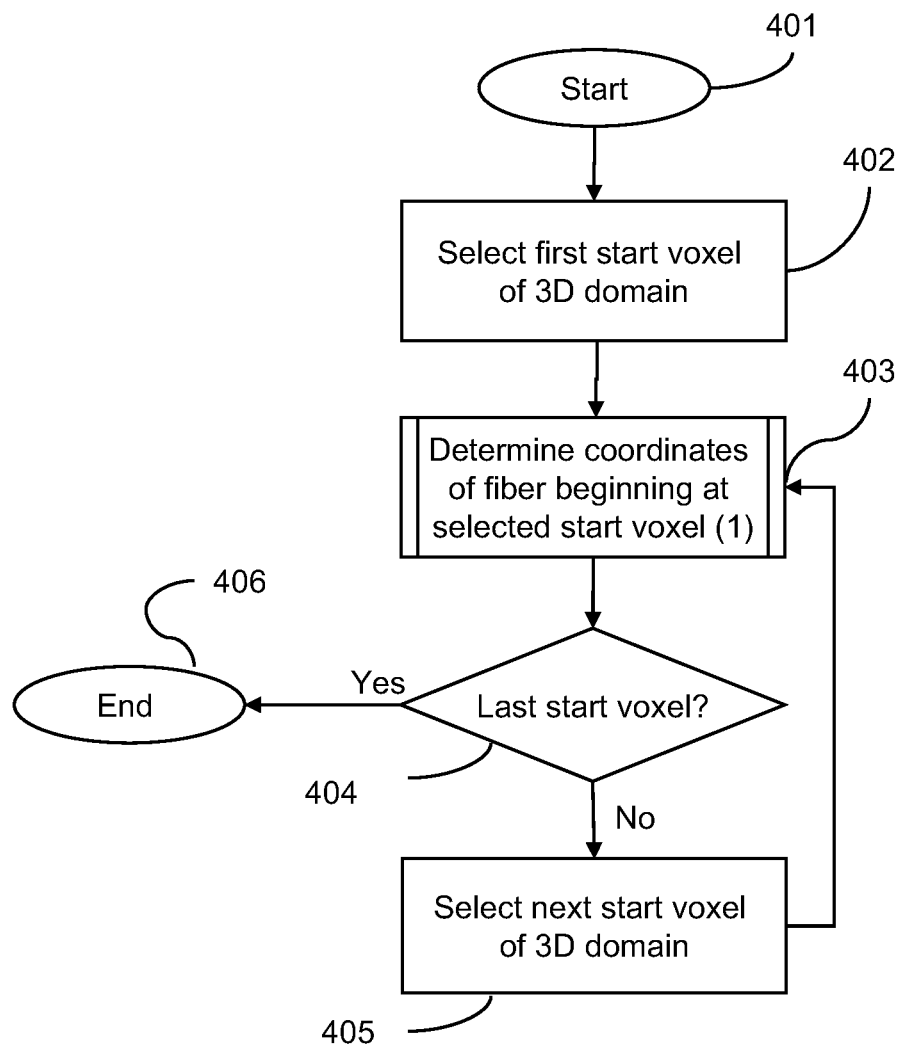
FIG. 4a-c are flow charts describing methods for tracking fiber tracts.
Figure 4B:
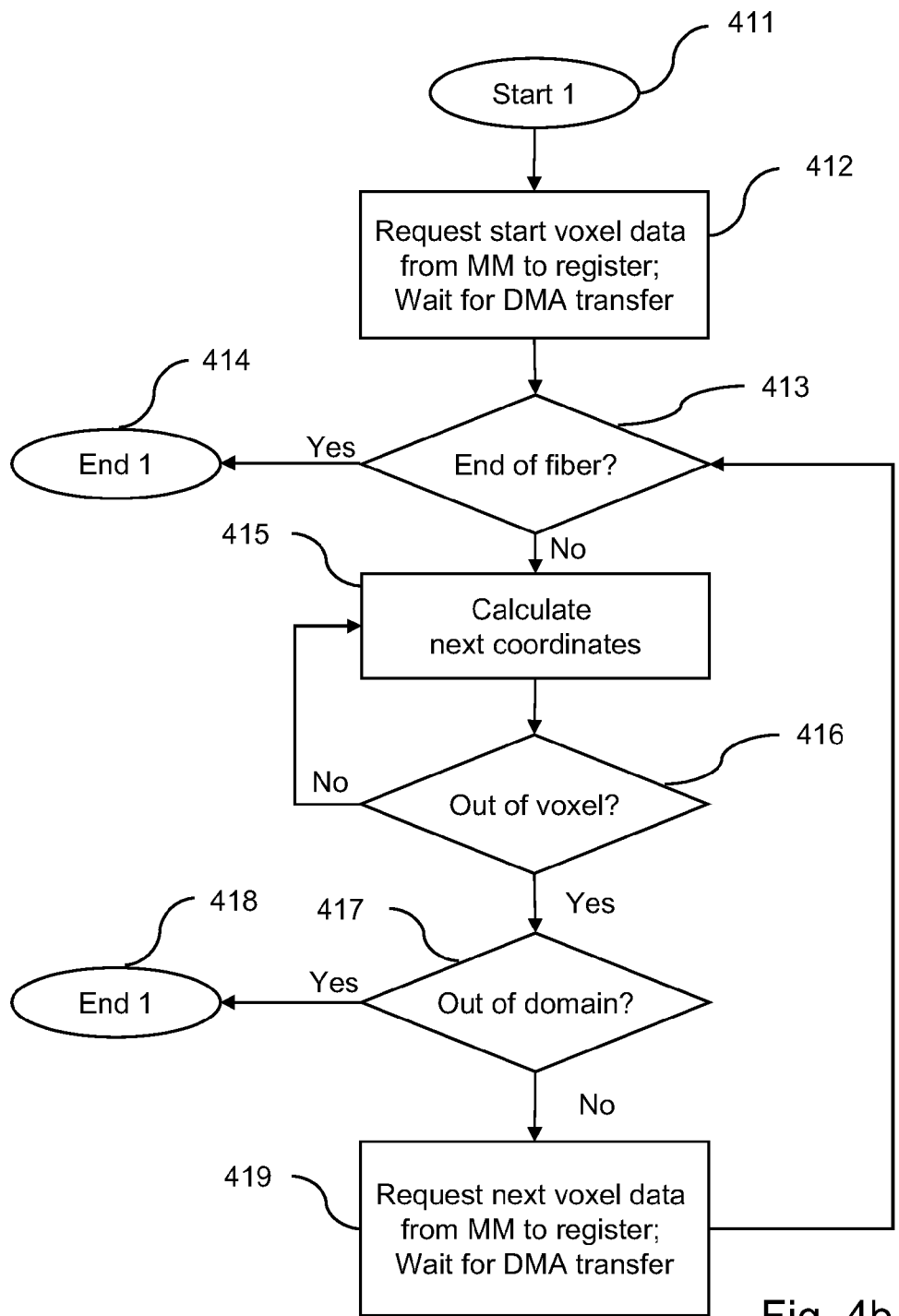
Figure 4C:
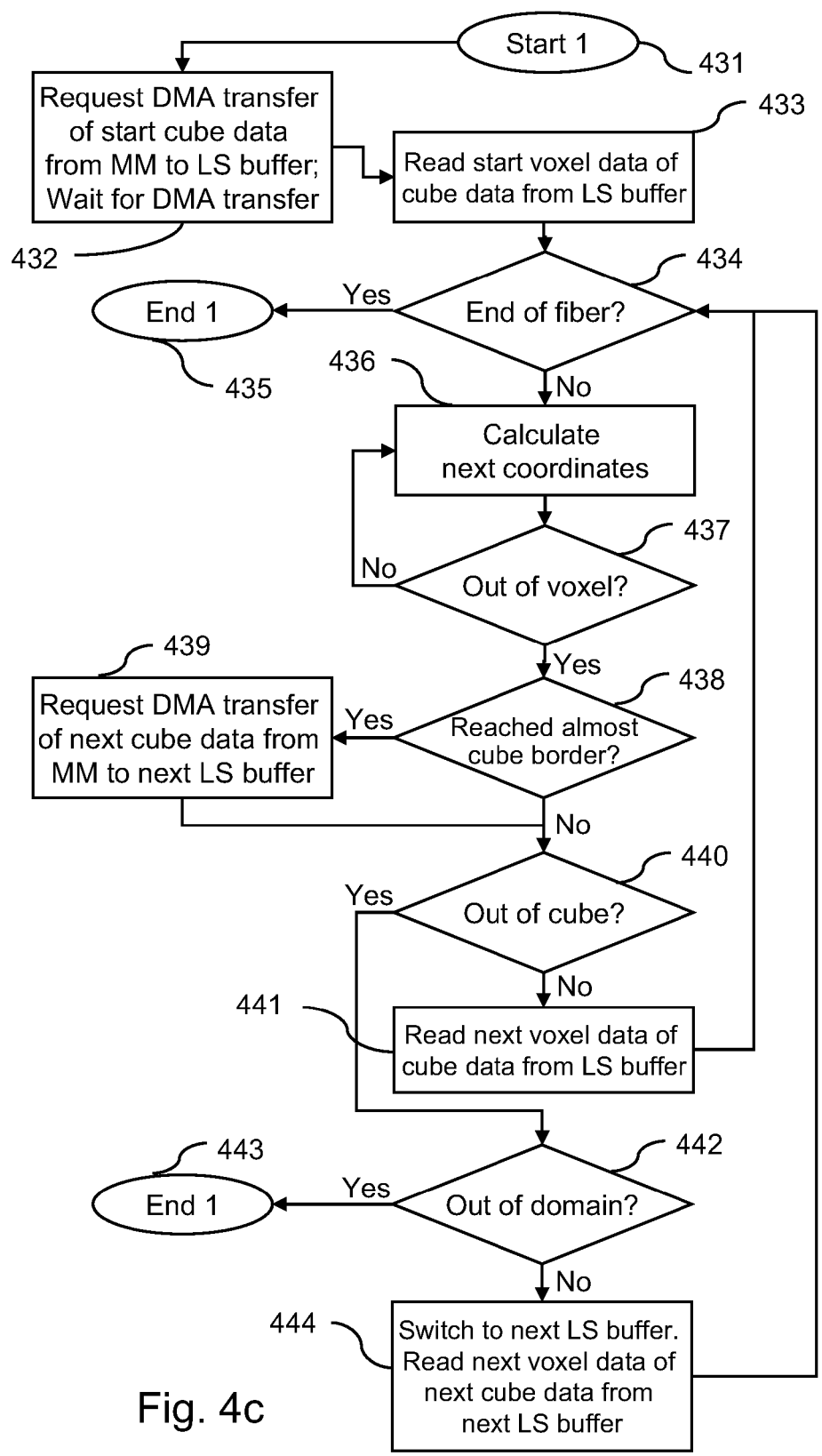

FIG. 4a-4c depict the flow charts describing methods for tracking fiber tracts. FIG. 4a shows the program loop that selects as a start voxel for one fiber tract every voxel out of a region of interest or out of the full 3D domain. The program loop starts from a selected (402) first start voxel, and determines (403) a sequence of coordinates describing the path of the fiber tract. This sub-process is described in the following FIGS. 4b and 4c. When the selected start voxel is not (404, "no") the last voxel of the set of start voxels, the next start voxel is selected (405) and the determination (403) of coordinates is continued. Otherwise (404, "yes"), the program loop is terminated (406).

FIG. 4b shows a conventional fiber tracking method (411) to determine coordinates of a fiber tract. A local processing unit begins (412) with a read request for data of one voxel from the main memory (MM) to a local register and waits for the completion of the DMA transfer. After receiving the data in the local register, the local processing unit checks (413) if the fiber tract has already reached the end, for example, if the Fractional Anisotropy value is less than a pre-defined threshold. As described above, this value may be 0.2. When the tracking cannot be continued (413, "yes"), the subprocess of calculating the coordinates ends (414). Otherwise (413, "no"), the local processing unit calculates the next coordinates from the read voxel data (415). In case of the start voxel, the calculations start from pre-determined coordinates, for example, the center of the voxel. When the calculated next coordinates are (416, "no") still within the volume of the current voxel, the local processing unit continues to calculate further next coordinates with the already read voxel data. When the next coordinates are (416, "yes") outside the voxel volume, the local processing unit checks (417) if the next coordinates will be outside the 3D domain. In this case (417, "yes"), the fiber tracking ends (418). If the fiber tracking can be continued (417, "no"), the local processing unit requests (419) the next DMA transfer of next voxel data from the main memory to the local register and waits for the completion of the DMA transfer. The next voxel data are checked (413) if the fiber tract has reached an apparent end, that is, if the tracking cannot be continued.

FIG. 4c describes an optimized fiber tracking method of the claimed invention. The Synergistic Processing Unit (SPU) of the Synergistic Processing Element (SPE) requests (432) a DMA transfer of not only data of one start voxel, but of a surrounding cuboid of multiple voxels, which may have the form of a cube. In the remainder of this description, the term cube may also be replaced with cuboid. At the beginning of the fiber tract, the start voxel is typically in the center of the requested start voxel cube volume. The SPU waits for the DMA transfer of the requested voxel cube data from the main memory (MM) into a local storage (LS) buffer of the SPE. The SPU reads (433) the data of the start voxel from the LS buffer and checks (434) if the fiber tract has already reached the end, for example, if the Fractional Anisotropy value is less than a pre-defined threshold. When the tracking cannot be continued (434, "yes"), the subprocess of calculating the coordinates ends (435). Otherwise (434, "no"), the SPU calculates (436) the next coordinates from the read voxel data. In case of the start voxel of the fiber tract, the calculation starts from pre-determined coordinates, for example, the center of the voxel volume. When the calculated next coordinates are (437, "no") still inside the volume of the current voxel, the SPU continues to calculate (436) other next coordinates with the already read voxel data. When the next coordinates are (437, "yes") outside the voxel volume, the SPU checks (438) if the next coordinates have almost reached the border of the voxel cube. This may be the case when the next coordinates have a distance of, for example, less than 2 voxel edge lengths from the cube border. This check is important to trigger (439)

the next DMA transfer of next voxel cube data from the main memory to the next LS buffer that is different from the current LS buffer. The SPU may use the current direction of the tracked fiber tract to determine the center of the next voxel cube volume. In the preferred embodiment, the next voxel cube overlaps the current voxel cube, i.e., shares at least some of the adjacent voxels. The SPU does not have to wait for the completion of the DMA process because the memory flow controller of the SPE accesses the main memory in parallel. When the reload of the next voxel cube data has (438, "no") not been triggered or is already in process, the SPU directly checks (440) if the next coordinates are located outside the voxel cube volume. If the next coordinates are (440, "no") still inside the voxel cube volume, the SPU reads (441) the corresponding next voxel data of the current voxel cube from the current LS buffer and continues tracking the fiber tract with the end-of-fiber check (434). When the next voxel is located (440, "yes") outside the current voxel cube volume, the SPU checks (442) if the next coordinates are already outside the pre-defined 3D domain. In this case (442, "yes"), the fiber tracking ends (443). If the fiber tracking can be continued (442, "no"), the SPU switches to the next LS buffer that holds the data of the next voxel cube, which have been loaded into the next LS buffer in parallel with calculations on voxel data from the current LS buffer (444). Alternatively, the SPU may be notified when the memory flow controller has completed the DMA transfer to the next LS buffer and the SPU switches to the next LS buffer in response to receiving this notification. The switch to the next LS buffer may happen even if the SPU can still read voxel data from the current LS buffer. After the switch to the next LS buffer, the SPU reads the next voxel data of the next voxel cube data from the next LS buffer and continues (434) tracking the fiber tract. The current LS buffer is ready to receive new voxel cube data at one of the next DMA transfers. The technique of using at least two buffers for alternatively receiving and processing data is known as double-buffering.

Figure 5:
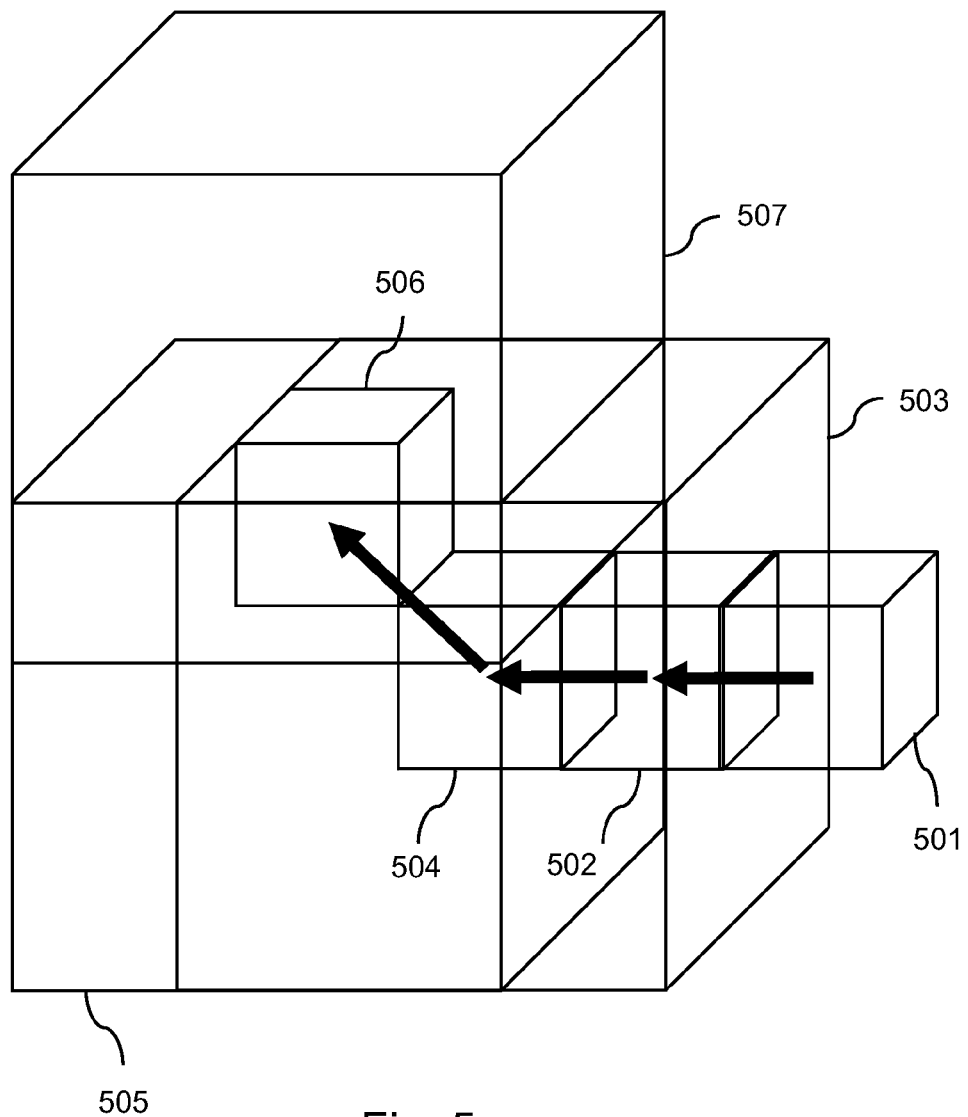
FIG. 5 illustrates a simplified three-dimensional tracking model.

FIG. 5 shows a fiber tracking sample, wherein data of a voxel cube with 3×3×3=27 voxels are loaded into the local storage buffer. While performing calculations on preceding voxels, such as (501), data of the voxel cube (503) are loaded into the first buffer. The position of the voxel cube is determined by the major eigenvector direction and position of the preceding voxel (501). When the voxel cube data (503) are ready to be processed from the first buffer, the calculation continues with the current voxel (502) based on the data in the first buffer. The major eigenvector direction of the current voxel (502) defines the voxel cube data (505) to be loaded into the second buffer and may provide the basis for the calculations from the next voxel (504). In the same manner, the voxel cube data (507) will be determined from the diffusion direction of the voxel (504) and loaded into a third buffer. If the first buffer is not used any more, the first buffer may be used instead of the third buffer. The calculations of voxel (506) may use the voxel cube data (505) or (507) depending on whether the requested voxel cube data have been loaded into the corresponding buffer.

Figure 6A:
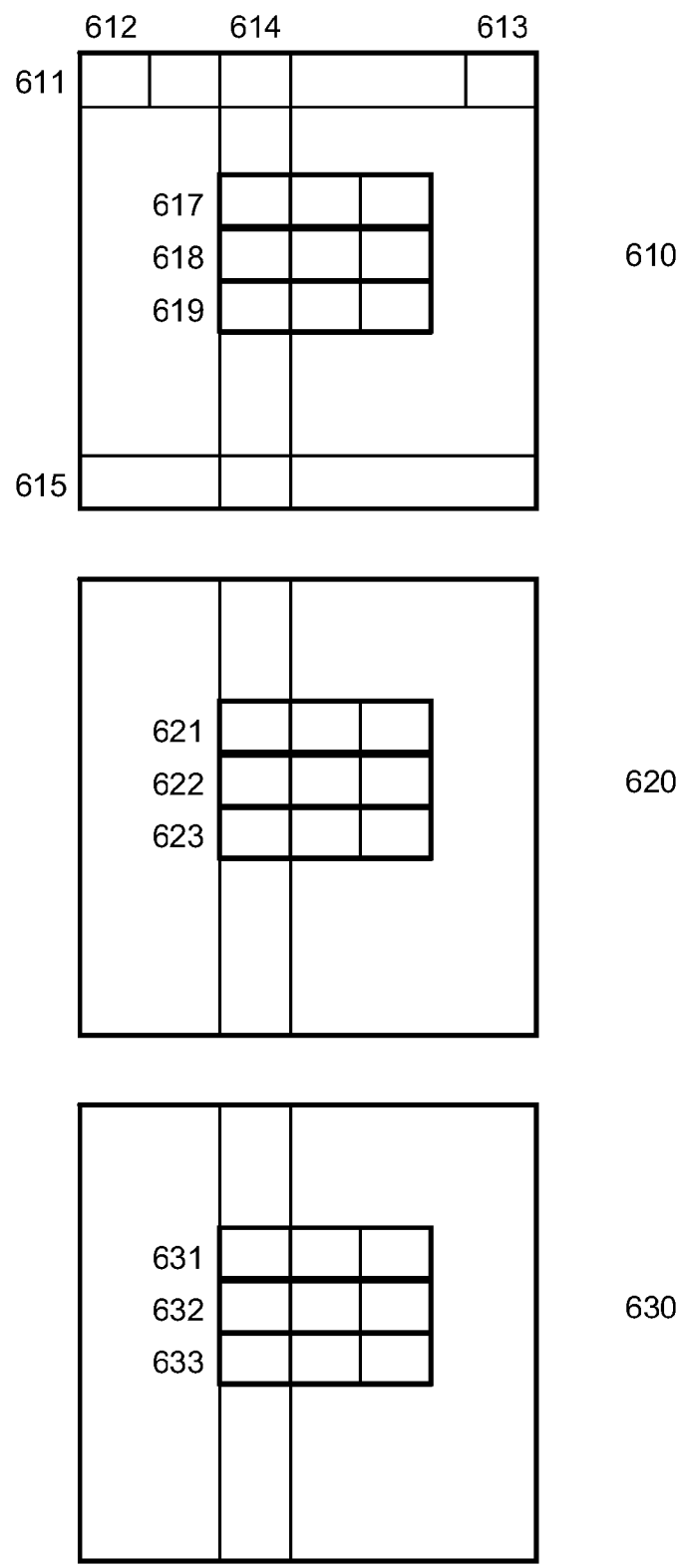
FIG. 6a illustrates a determination of address parameters of DMA transfer lists.

FIG. 6*a* shows how the data entities associated with points in a three-dimensional domain are stored in the main memory. In a simplified model, we assume that the data entities have a size of a power-of-two. In the preferred embodiment, the 3D domain has 256×256×36=voxels, that is, 36 slices, each slice with 256 rows, and each row with 256 columns. The voxel data are stored in the main memory row by row, and slice by slice. The data of a voxel cube segment are loaded from the main memory into the LS buffer. In the sample of the FIG. 6*a*, the cube segment has 3×3×3=27 voxels. Three adjacent slices (610, 620, 630) store the voxels of the cube segment. In the main memory, the first row of the slice (610) is (611) and the last row is (615). The first voxel of row (611) belongs to column (612) and the last voxel to column (613). The rows (617, 618, 619) contain the voxels of the cube segment starting at column (614) and having a length of 3 voxels. In slice (620), the cube segment voxels are stored at rows (621,622, 623), and in slice (630) at rows (631,632,633).

The parameters for a two-dimensional (2D) DMA list include
1) the number of voxels of a row for each DMA transfer, for example, 3, which may be denoted as a first segment dimension, and 4 byte long address offsets of the three first voxels of the respective rows (617,618,619) at column (614). The determination of these address offsets requires:
2) the effective start address of the first voxel at row (617) and column (614),
3) the row length of the domain, that is, the number of columns in one row (612, . . . , 613) of the slice (610), for example, 256, which is also called a first domain dimension,
4) the number of the segment rows (617, 618, 619) in the slice (610), for example, 3, which is also named a second segment dimension, The parameters for a three-dimensional (3D) DMA list include the number of voxels of a row for each DMA transfer and 4 byte long address offsets of the nine first voxels of the respective rows (617, 618, 619, 621, 622, 623, 631, 632, 633) at column (114). The determination of these start addresses further requires:
5) the area size of the slice, that is, a product of the number of rows and columns in each slice, for example, 256× 256=65536, which is a product of the first and a second domain dimension,
6) the number of segment slices (110, 120, 130) in the 3D domain, for example, 3, which may be denoted as a third segment dimension.

FIG. 6*b* explains how the Single Instruction on Multiple Data (SIMD) feature of the CEB processor can be applied to calculate the start addresses for the DMA list. The example requires 3 registers (0A, 0B, 0C) with a length of 128 bits, that is 4×32 bits, wherein 32 bits are equal to 4 bytes and can store a long integer value. SIMD allows simultaneous operation on 4 numbers. In this example, the cube segment has 4 rows in one slice. The start address of the first row is 2000, which is stored in register 0A four times and the number of columns in a row of the domain is stored in register 0B four times. In register 0C, the multipliers for the rows of the slice are incrementally stored, that is, 00, 01, 02, and 03. In one SIMD operation, 4 long integer numbers of register 0B are multiplied with the respective 4 long integer numbers of register 0C and added to the respective 4 long integer numbers of register 0A. This operation results in the start addresses of the four DMA transfers in register 0A'.

The preferred embodiment reads a cuboidal segment of 4 rows of 4 slices, and each row has 32 columns, which makes up 4×4=16 DMA transfers with 32 data entities of 20 bytes each. Each data entity comprises 16 bytes for the three major eigenvector components and 4 bytes for the FA value.

The SIMD technique can also be applied to various floating point operations. The preferred embodiment uses the SIMD operations to determine the coefficients of the symmetric diffusion tensor, and the associated eigenvectors, eigenvalues and Fractional Anisotropy.

The current and the next voxel cubes do not need overlapping voxels, but can also have only adjacent voxels.

The local storage can have more than two buffers for data read from the main memory, which are sequentially loaded. When the amount of calculated data is not too large, the local storage can be sufficient for the calculated data. Otherwise, double- or multi-buffering can also be applied to calculated data before storing in the main memory.

Figure 7A:
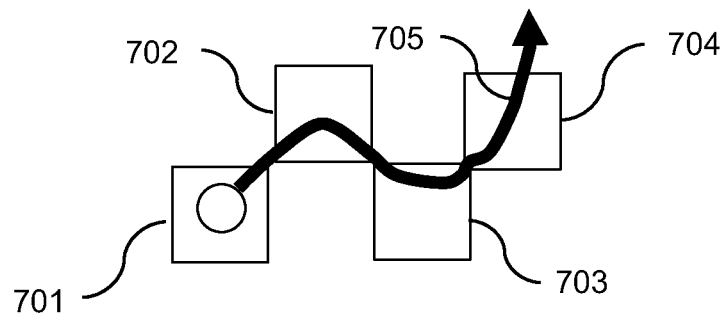
FIGS. 7a and 7b illustrate simplified two-dimensional tracking models.
Figure 7B:
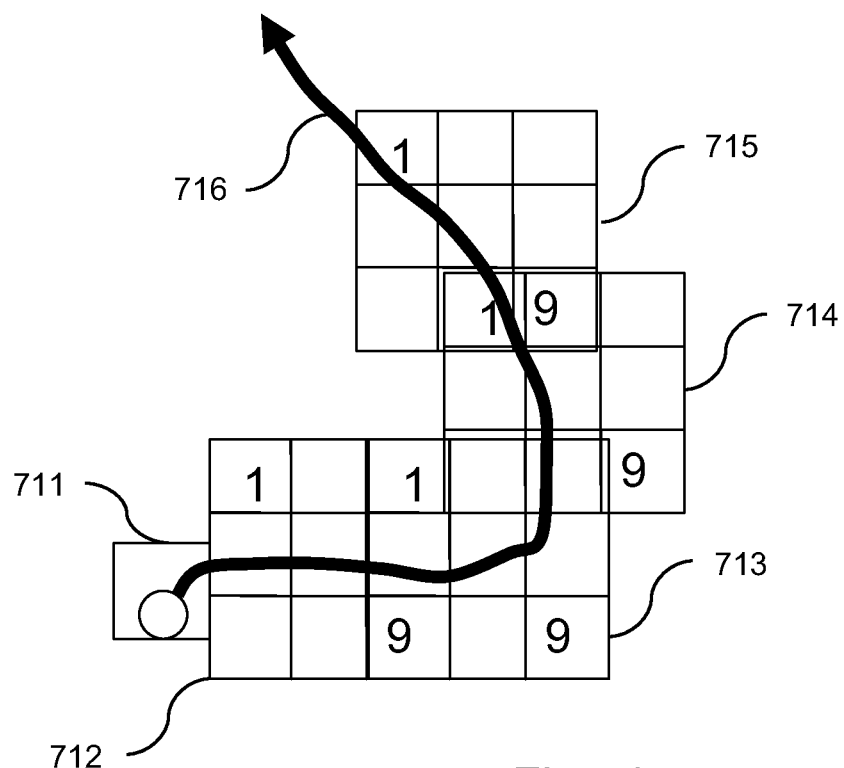

The method of the present invention can alternatively be applied to pixel data in two dimensions. Examples are path determination on maps. FIG. 7a shows a conventional two-dimensional tracking method, which loads the required pixel data (701, 702, 703, 704) sequentially into a register to determine a path (705). FIG. 7b applies the method of the present invention and loads segments (712, 713, 714, 715) of pixel data from the main memory into the local store. The segments are pixel rectangles or pixel squares and the calculations are starting from an initial pixel (711) to determine the path (716).

The form and size of the cuboidal segments is not necessarily static, but can also be dynamic. The form and size of the 3D segment can change depending on the direction of the major eigenvector. This means that the 3D segment is advantageously larger in the current fiber direction and smaller in perpendicular directions.

The check (438) for triggering (439) the next DMA transfer can optionally be performed when the next coordinates are found in a certain sub-segment of the voxel cube segment, for example in a second half when preceding coordinates are located in a first half of the voxel cube segment.

To reduce the amount of calculated data, a so-called culling algorithm known in prior art can be applied, which aggregates vicinal calculated data and eliminates implausible calculated data.

The path determination method of the present invention is not limited to fiber tractography, but can also be applied to any kind of propagation of physical particles and waves in a heterogenous environment. Interesting fields of application are gas transport in meteorology, liquid transport in oceanography, and wave propagation in liquid or solid matter. The path determination method can also be applied to motion tracking, wherein the data entities comprise image information that is dynamically changing.

The invention claimed is:

1. A method for processing data entities by a data processing system, the data processing system having a main memory (MM) and a first processing element, the main memory storing the data entities to be processed, the first processing element having a local storage, the method comprising:

loading a first set of voxels of a fiber tract for tracking from the main memory into the local storage, the first set of voxels being associated with a first set of respective contiguous points in three dimensional (3D) space of a 3D domain, wherein a voxel is a portion of volume of the 3D domain, wherein the 3D domain is a cuboid, wherein a set of voxels is associated with respective points of a 3D cuboidal segment of the 3D domain and wherein a form of the first set of voxels is a 3D cube;

performing a first set of calculations using the first set of voxels to generate a first calculated data; determining a next set of voxels from the main memory according to the first calculated data, the next set of voxels being associated with a next set of respective contiguous points of the 3D domain;

determining whether the next set of respective contiguous points is less than a predetermined distance from an edge of the first set of voxels;

in response to determining the next set of respective contiguous points is less than a predetermined distance from the edge of the first set of voxels, loading the next set of voxels from the main memory into the local storage;

dynamically changing, based on a current direction of a path vector of the fiber tract, a form and a size of the next set of voxels, wherein a segment dimension of the next set of voxels is advantageously larger in the current direction of the path vector of the fiber track and segment dimensions of the next set of voxels are smaller in perpendicular directions; and performing a next set of calculations using the next set of voxels to generate a next calculated data.

2. The method of claim 1, further comprising:
determining whether the next set of respective contiguous points is outside of the 3D domain;
determining whether the next set of respective contiguous points is outside of the first set of voxels;
in response to determining the next set of respective contiguous points is on an edge of the 3D domain or is inside of the 3D domain, continuing any tracking of the fiber tract; and
in response to determining the next set of respective contiguous points is outside of the 3D domain and the first set of voxels, terminating any tracking of the fiber tract;
wherein:
the local storage has a first and a next buffer; the first set of voxels is loaded into the first buffer;
the first set of calculations comprise a pre-determined load calculation step to determine the next set of voxels; and
performing of the first set of calculations is continued during loading of the next set of voxels into the next buffer.

3. The method of claim 1, further comprising:
determining a fractional anisotropy value of the first set of voxels;
in response to the fractional anisotropy value of the first set of voxels exceeding a start threshold, using the first set of voxels as a starting point for the fiber tract;
determining, during tracking of the fiber tract, whether the fractional anisotropy value is less than a predetermined value; and
in response to determining the fractional anisotropy value is less than the predetermined value, terminating tracking of the fiber tract;
wherein:
the first set of calculations perform a sequence of calculation steps using respective subsets of the voxels associated with respective subsets of contiguous points of the 3D domain, wherein a succeeding calculation step uses a subset of the voxels determined by a preceding calculation step;
an initial subset of the voxels is pre-determined; and
a final calculation step of the first calculations is also pre-determined.

4. The method of claim 1, wherein:
the first and next sets of voxels, the first calculated data, and the next calculated data comprise coordinate information referring to points of the 3D domain;
the voxels further comprise direction information used for calculating the coordinate information and a termination information that is used to determine a final calculation step; and
the voxels of the 3D domain are obtained by a 3D imaging technique and the direction information represents an orientation of physical entities in 3D space.

5. The method of claim 1, wherein the data processing system is a parallel processing system, the method further comprising:
- the first processing element loads a first sequence of sets of voxels to perform a first sequence of respective calculations in order to generate a first image data;
- a second processing element loading a next sequence of sets of voxels to perform a next sequence of respective calculations, which generate a next image data; and
- superimposing the first and next image data to produce superimposed image data.

6. The method of claim 1, wherein:
- a set of direct memory access (DMA) lists determines the set of voxels being associated with respective points of the 3D cuboidal segment, including an initial address of the main memory, a first segment dimension, a second segment dimension, a third segment dimension, a first 3D domain dimension and a second 3D domain dimension; and
- the calculations are performed by using single instructions on multiple data (SIMD).

7. The method of claim 1, further comprising:
- acquiring a 3D image data from an echo planar imaging of an object utilizing twenty (20) different gradient field directions and one 3D image without diffusion gradient field; and
- scaling the dimensions of each voxel to a symmetrical cube having unity edge lengths;
- wherein:
  - the 3D domain comprises 36 contiguous axial slices, each slice comprising 256 rows and 256 columns of voxels and having a thickness of 3.6 millimeters (mm);
  - the form of the first set of voxels is a 3 by 3 by 3 (3×3×3) 3D cube of voxels; and
  - each voxel has dimensions of 1 mm by 1 mm by 3.6 mm.

8. The method of claim 1, wherein tracking of the fiber tract further comprises:
- interpolating directions of a path vector of a voxel containing a current tracking point of the respective contiguous points and at least one closest adjacent voxel by weighting the distance between the centers of the voxel containing the current tracking point and the at least one closest adjacent voxel;
- interpolating directions of a path vector of the voxel containing the current tracking point and a subset of surrounding voxels by weighting the distance between the centers of the voxel containing the current tracking point and the subset of surrounding voxels;
- fixing a scaling of a path vector length to less than a voxel edge length; and
- dynamically scaling the path vector length based on a Fractional Anisotropy value;
- wherein calculating the next set of respective contiguous points further comprises using one or more previous coordinates to determine a direction of trajectory of the fiber tract.

9. The method of claim 1, wherein the fiber tract is a propagation of physical particles and waves in a heterogeneous environment, and wherein the 3D image data is dynamically changing.

10. A data processing system, comprising:
- a main memory (MM) for storing data entities being associated with respective points of a three dimensional (3D) domain;
- a first processing element having: a processing unit, a local storage (LS) and a memory flow controller (MFC);
- logic executing on the first processing element that enables the first processing element to:
  - load a first set of voxels of a fiber tract for tracking from the main memory into the local storage, the first set of voxels being associated with a first set of respective contiguous points in 3D space of the 3D domain, wherein a voxel is a portion of volume of the 3D domain, wherein the 3D domain is a cuboid, wherein a set of voxels is associated with respective points of a 3D cuboidal segment of the 3D domain and wherein a form of the first set of voxels is a 3D cube;
  - perform a first set of calculations using the first set of voxels to generate a first calculated data;
  - determine a next set of voxels from the main memory according to the first calculated data, the next set of voxels being associated with a next set of respective contiguous points of the 3D domain;
  - determine whether the next set of respective contiguous points is outside of the first set of voxels;
  - in response to determining the next set of respective contiguous points is less than a predetermined distance from the edge of the first set of voxels, load the next set of voxels from the main memory into the local storage;
  - dynamically change, based on a current direction of a path vector of the fiber tract, a form and a size of the next set of voxels, wherein a segment dimension of the next set of voxels is advantageously larger in the current direction of the path vector of the fiber track and segment dimensions of the next set of voxels are smaller in perpendicular directions; and
  - perform a next set of calculations using the next set of voxels to generate a next calculated data.

11. The system of claim 10, further comprising:
- a first buffer of the local storage for storing the first set of voxels;
- a next buffer of the local storage for storing the determined next set of voxels;
- the logic further comprising logic that enables the first processing element to:
  - determine whether the next set of respective contiguous points is outside of the 3D domain;
  - determine whether the next set of respective contiguous points is outside of the first set of voxels;
  - in response to determining the next set of respective contiguous points is on an edge of the 3D domain or is inside of the 3D domain, continue any tracking of the fiber tract;
  - in response to determining the next set of respective contiguous points is outside of the 3D domain and the first set of voxels, terminate any tracking of the fiber tract;
  - load the first set of voxels into the first buffer;
  - load the next set of voxels into the next buffer;
  - perform the first set of calculations on the first set of voxels stored in the first buffer, the performing the first set of calculations further comprising a load calculation step that pre-determines the next set of voxels;
  - determine a fractional anisotropy value of the first set of voxels;
  - in response to the fractional anisotropy value of the first set of voxels exceeding a start threshold, using the first set of voxels as a starting point for the fiber tract;
  - determine, during tracking of the fiber tract, whether the fractional anisotropy value is less than a predetermined value; and
  - in response to determining the fractional anisotropy value is less than the predetermined value, terminate tracking of the fiber tract;

wherein the performing of the first calculations is continued during loading of the determined next set of voxels into the next buffer.

12. The system of claim 10, the logic further comprising logic that enables the first processing element to:
    load a first sequence of sets of voxels to perform a first sequence of respective calculations in order to generate a first image data; and
    superimpose the first image data and a next image data to produce superimposed image data, wherein a next processing element loads a next sequence of sets of voxels to perform a next sequence of respective calculations in order to generate a next image data;
    wherein:
        a set of direct memory access (DMA) lists determines the set of voxels being associated with respective points of the 3D cuboidal segment, including an initial address of the main memory, a first segment dimension, a second segment dimension, a third segment dimension, a first 3D domain dimension and a second 3D domain dimension;
        the 3D domain comprises 36 contiguous axial slices, each slice comprising 256 rows and 256 columns of voxels and having a thickness of 3.6 millimeters (mm);
        the form of the first set of voxels is a 3 by 3 by 3 (3×3×3) 3D cube of voxels; each voxel has dimensions of 1 mm by 1 mm by 3.6 mm; and
        the dimensions of each voxel is scaled to a symmetrical cube having unity edge lengths.

13. The system of claim 10, wherein tracking of the fiber tract further comprises:
    interpolate directions of a path vector of a voxel containing a current tracking point of the respective contiguous points and at least one closest adjacent voxel by weighting the distance between the centers of the voxel containing the current tracking point and the at least one closest adjacent voxel;
    interpolate directions of a path vector of the voxel containing the current tracking point and a subset of surrounding voxels by weighting the distance between the centers of the voxel containing the current tracking point and the subset of surrounding voxels;
    fix a scaling of a path vector length to less than a voxel edge length; and
    dynamically scale the path vector length based on a Fractional Anisotropy value;
    wherein calculating the next set of respective contiguous points further comprises using one or more previous coordinates to determine a direction of trajectory of the fiber tract.

14. A computer program product executing on a parallel data processing system comprising computer program code stored on a computer readable storage apparatus that when executed within a computing device performs a method for processing voxels associated with respective points of a three dimensional (3D) domain, the parallel data processing system having a main memory (MM) storing the voxels to be processed and a first processing element having a local storage, the method comprising:
    loading a first set of voxels of a fiber tract for tracking from the main memory into the local storage, the first set of voxels being associated with a first set of respective contiguous points in 3D space of the 3D domain, wherein a voxel is a portion of volume of the 3D domain, wherein the 3D domain is a cuboid, wherein a set of voxels is associated with respective points of a 3D cuboidal segment of the 3D domain and wherein a form of the first set of voxels is a 3D cube;
    performing a first set of calculations using the first set of voxels to generate a first calculated data;
    determining a next set of voxels from the main memory according to the first calculated data, the next set of voxels being associated with a next set of respective contiguous points of the 3D domain;
    determining whether the next set of respective contiguous points IS less than a predetermined distance from an edge of the first set of voxels;
    in response to determining the next set of respective contiguous points is less than a predetermined distance from the edge of the first set of voxels, loading the next set of voxels from the main memory into the local storage;
    dynamically changing, based on a current direction of a path vector of the fiber tract, a form and a size of the next set of voxels, wherein a segment dimension of the next set of voxels is advantageously larger in the current direction of the path vector of the fiber track and segment dimensions of the next set of voxels are smaller in perpendicular directions; and
    performing a next set of calculations using the next set of voxels to generate a next calculated data.

15. The computer program product of claim 14, the program code further comprising code for:
    determining whether the next set of respective contiguous points is outside of the 3D domain;
    determining whether the next set of respective contiguous points is outside of the first set of voxels;
    in response to determining the next set of respective contiguous points is on an edge of the 3D domain or is inside of the 3D domain, continuing any tracking of the fiber tract;
    in response to determining the next set of respective contiguous points is outside of the 3D domain and the first set of voxels, terminating any tracking of the fiber tract; and
    wherein:
        the local storage has a first buffer and a next buffer;
        the first set of voxels is loaded into the first buffer;
        the first set of calculations comprise a pre-determined load calculation step to determine the next set of voxels; and
        the first set of calculations is continued during loading of the next set of voxels into the next buffer.

16. The computer program product of claim 14, the method further comprising:
    determining a fractional anisotropy value of the first set of voxels;
    in response to the fractional anisotropy value of the first set of voxels exceeding a start threshold, using the first set of voxels as a starting point for the fiber tract;
    determining, during tracking of the fiber tract, whether the fractional anisotropy value is less than a predetermined value; and
    in response to determining the fractional anisotropy value is less than the predetermined value, terminating tracking of the fiber tract;
    wherein:
        the first set of calculations perform a sequence of calculation steps using respective subsets of the voxels associated with respective subsets of voxels of the 3D domain, wherein a succeeding calculation step uses a subset of the voxels that is determined by a preceding calculation step;
        an initial subset of the voxels is pre-determined; and a final calculation step of the first calculations is also pre-determined.

17. The computer program product of claim 14, wherein:
the voxels, the first calculated data, and the next calculated data comprise coordinate information referring to points of the 3D domain;
the voxels further comprise direction information used for calculating the coordinate information and a termination information that is used to determine a final calculation step; and
the voxels of the 3D domain are obtained by a 3D imaging technique and the direction information represents an orientation of physical entities in 3D space.

18. The computer program product of claim 14, wherein:
the first processing element loads a first sequence of sets of voxels to perform a first sequence of respective calculations in order to generate a first image data; and
the method further comprising:
a second processing element loading a next sequence of sets of voxels to perform a next sequence of respective calculations, which generate a next image data; and
superimposing the first and next image data to produce superimposed image data.

19. The computer program product of claim 14, wherein:
the 3D domain is a three dimensional (3D) cuboid comprises 36 contiguous axial slices, each slice comprising 256 rows and 256 columns of voxels and having a thickness of 3.6 millimeters (mm);
a set of direct memory access (DMA) lists determines the set of voxels being associated with respective points of the 3D cuboidal segment, including an initial address of the main memory, a first segment dimension, a second segment dimension, a third segment dimension, a first 3D domain dimension and a second 3D domain dimension;
the calculations are performed by using single instructions on multiple data (SIMD);
the form of the first set of voxels is a 3 by 3 by 3 (3×3×3) 3D cube of voxels;
each voxel has dimensions of 1 mm by 1 mm by 3.6 mm; and
the dimensions of each voxel is scaled to a symmetrical cube having unity edge lengths.

20. The computer program product of claim 14, wherein:
interpolating directions of a path vector of a voxel containing a current tracking point of the respective contiguous points and at least one closest adjacent voxel by weighting the distance between the centers of the voxel containing the current tracking point and the at least one closest adjacent voxel;
interpolating directions of a path vector of the voxel containing the current tracking point and a subset of surrounding voxels by weighting the distance between the centers of the voxel containing the current tracking point and the subset of surrounding voxels;
fixing a scaling of a path vector length to less than a voxel edge length; and
dynamically scaling the path vector length based on a Fractional Anisotropy value;
wherein calculating the next set of respective contiguous points further comprises using one or more previous coordinates to determine a direction of trajectory of the fiber tract.

* * * * *